United States Patent [19]

Otake et al.

[11] Patent Number: 5,595,939
[45] Date of Patent: Jan. 21, 1997

[54] LIQUID-SEALED SEMICONDUCTOR PRESSURE SENSOR AND MANUFACTURING METHOD THEREOF

[75] Inventors: Seiichirou Otake, Hazu-gun; Yoshifumi Watanabe, Nukata-gun; Yukihiro Kato, Toyoake, all of Japan

[73] Assignee: Nippondenso Co., Ltd., Kariya, Japan

[21] Appl. No.: 394,300

[22] Filed: Feb. 24, 1995

[30] Foreign Application Priority Data

Mar. 4, 1994 [JP] Japan .................. 6-034359

[51] Int. Cl.$^6$ .................................. H01L 21/60
[52] U.S. Cl. ................. 437/209; 437/7; 437/211; 437/212; 437/215; 437/216
[58] Field of Search ................. 437/209, 210, 437/211, 212, 218, 216, 217, 7; 73/706, 726, 756

[56] References Cited

U.S. PATENT DOCUMENTS

| | | | |
|---|---|---|---|
| 4,470,856 | 9/1984 | Little et al. ................. | 437/7 |
| 4,472,239 | 9/1984 | Johnson et al. ................. | 437/7 |
| 4,633,573 | 1/1987 | Scherer ................. | 437/211 |
| 4,770,050 | 9/1988 | Häfner ................. | 73/746 |
| 4,843,454 | 6/1989 | Kato et al. ................. | 73/723 |
| 4,876,893 | 10/1989 | Kato et al. ................. | 73/726 |
| 4,928,376 | 5/1990 | Poglitsch ................. | 73/756 |
| 5,000,047 | 3/1991 | Kato et al. ................. | 73/706 |
| 5,386,730 | 2/1995 | Ikeda et al. . | |
| 5,436,202 | 7/1995 | Miura ................. | 437/209 |

FOREIGN PATENT DOCUMENTS

| | | |
|---|---|---|
| 4036994 | 5/1992 | Germany . |
| 4321068 | 1/1994 | Germany . |
| 63-255636 | 10/1988 | Japan . |
| 63-243830 | 10/1988 | Japan . |
| 4-285832 | 10/1992 | Japan . |
| 4-309831 | 11/1992 | Japan . |
| 5-149814 | 6/1993 | Japan . |
| 7-209115 | 8/1995 | Japan . |

*Primary Examiner*—Kevin M. Picaroat
*Attorney, Agent, or Firm*—Cushman, Darby & Cushman IP Group of Pillsbury Madison & Sutro LLP

[57] ABSTRACT

A liquid-sealed type semiconductor pressure sensor with no filling orifice includes a connector housing which is made of high polymer compound material of high air permeability and which has a recess and connector pins, where a main housing which has a sealing diaphragm is secured to the connector housing airtightly and a pressure sensitive element is disposed in the recess and is electrically connected to external circuitry by connector pins. A pressure detecting chamber formed between the recess and the sealing diaphragm is filled with pressure transmitting medium, such as silicone oil, having high air solubility. To manufacture the sensor, the recess is filled with a fixed volume of the pressure transmitting medium, the main housing is placed on the connector housing, and a prescribed pressure is applied to the sensor to dissolve air trapped in the pressure detecting chamber during the previous step into the transmitting medium and to purge the rest through the high polymer compound materials used in the connector housing. As a result, a non-linear pressure rise in the pressure detecting chamber can be prevented.

12 Claims, 7 Drawing Sheets

LIQUID-SEALED SEMICONDUCTOR PRESSURE SENSOR AND MANUFACTURING METHOD THEREOF

CROSS REFERENCE TO RELATED APPLICATION

The present application is based on and claims priority from Japanese Patent Application No. Hei 6-34359 filed on Mar. 4, 1994, the content of which are incorporated herein by reference.

BACKGROUND OF THE INVENTION

1. Field of the Invention

The present invention relates to a liquid-sealed type semiconductor pressure sensor and a method for manufacturing such a pressure sensor in which a pressure transmitting medium such as insulating oil fills a pressure detecting chamber and sealed by a sealing diaphragm.

2. Description of the Related Art

Although not prior art to the present invention, Japanese Patent Application No. Hei 6-6269 laid open as publication No. 7-20115 on Aug. 11, 1995, discloses the liquid-sealed type semiconductor pressure sensor illustrated in FIG. 7, in which a semiconductor pressure sensing element 1 is disposed in a recess of a connector housing 3, a main housing 4 having a sealing diaphragm 5 previously secured thereto is placed on the connector housing 3, and, thereafter, filler oil 7 as a pressure transmitting medium is filled through a filling orifice 3b into a pressure detecting chamber. The orifice 3b is then sealed by a sealing material such as a spherical rubber member (e.g. rubber ball), an annular rubber packing member 16 having annular projections on its peripheral surface, or the like. Thus, the filling orifice 3b is sealed up air-tightly.

However, the filling orifice represents a relatively complicated structure for the purposes of manufacture and installation, and increases the size of the pressure sensor. An increase in the number of sealing portions also may cause decrease in reliability. Moreover, such features necessitate additional members and work for sealing, thereby resulting in an increase of the device's manufacturing cost.

The temperature characteristics of the relationship of the liquid-sealed pressure sensor will be discussed next with reference to FIG. 6.

When no excessive internal pressure exists in the pressure detecting chamber, the characteristic curve of the internal pressure to the temperature is shown by curve D in which the pressure in the pressure detecting chamber at an ambient temperature (25° C.) is indicated by point A (pressure in the pressure detecting chamber is 0), and the curve has a temperature coefficient corresponding to thermal expansion of the filler oil 7 and other elements. The curve is almost linear over the temperature range of practical use (−30 through 125° C.), and may be compensated to conform to a curve D' by a control circuit which converts the change in the resistance of the pressure sensitive element into voltage and compensates the variation in the pressure sensor signal due to temperature change (compensation ①') by a corresponding change in the voltage. As a result, a pressure sensor which operates on the curve D' or which is free of temperature variation may be provided. However, if the volume of the filler oil 7 contained in the pressure detecting chamber is too much for the sealing diaphragm 5 and causes the diaphragm 5 to bend and separate from the pressure sensitive element 1, the pressure in the pressure detecting chamber changes on a curve C and comes to a point B (pressure P in the pressure detecting chamber is a positive value) at the ambient temperature (25° C.). The curve C rises sharply at a portion in the higher temperature range; in other words, the pressure P in the pressure detecting chamber rises sharply. That is, the pressure in the pressure detecting chamber P changes linearly as temperature changes in a lower temperature range, however the pressure in the pressure detecting chamber increases more sharply than the temperature, and the proportional relation therebetween fails at the higher temperature range. As a result, the aforementioned temperature compensation by the control circuit (compensation ① for the curve C') is not effectively applicable, nor is shifting of the output voltage of the control circuit (compensation indicated by an arrow ②) effective.

When bubbles exist in the pressure detecting chamber, positive or negative pressure applied to the sealing diaphragm 5 is not accurately transmitted to the pressure sensitive element due to the bubbles which contract or expand under the pressure applied thereto, thereby causing a pressure loss. Thus, in order to transmit the pressure applied to the sealing diaphragm 5 to the pressure sensitive element 1 accurately, an appropriate volume of the filler oil 7 without air bubbles is required for proper functioning of the pressure transmitting medium.

SUMMARY OF THE INVENTION

The present invention is made in view of the foregoing problems, and has a primary object of providing an improved liquid-sealed semiconductor pressure sensor which contains a sealed quantity of filler liquid or oil without providing a filling orifice as described above and a method of manufacturing such a pressure sensor.

Another object of the present invention is to provide an improved method for manufacturing a pressure sensor in which a pressure detecting chamber is formed between a first housing having a recess and a second housing having a sealing member. The method includes a first step of filling a prescribed amount of filler oil as pressure transmitting medium into the recess of the first housing, a second step of press-fitting the second housing having the sealing member to form the pressure detecting chamber, and a third step of applying to the pressure detecting chamber a prescribed pressure to dissolve air trapped in the transmitting medium of the pressure detecting chamber during the step of press-fitting the second housing.

According to the present invention, the pressure detecting chamber may accommodate the transmitting medium liquid-tightly without the use of any filling orifice. Since the sealing of the orifice after filling the filler oil is not necessary, a sealing member such as a spherical rubber member and its securing member is not necessary, and a simple structure of the liquid sealed pressure sensor may be realized along with a simple way of sealing the liquid at a much lower manufacturing cost.

Further, the volume of the filler oil is controlled not to generate an excessive internal pressure so that any pressure change caused owing manufacturing processes may be prevented.

Thus, there is provided a filling orifice-less pressure sensor which is accurate and inexpensive and which performs well over a wide range of temperatures, and which also ensures high manufacturing efficiency and productivity.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENT

Preferred embodiment according to the present invention will now be described with reference to the appended drawings.

Figure 1:
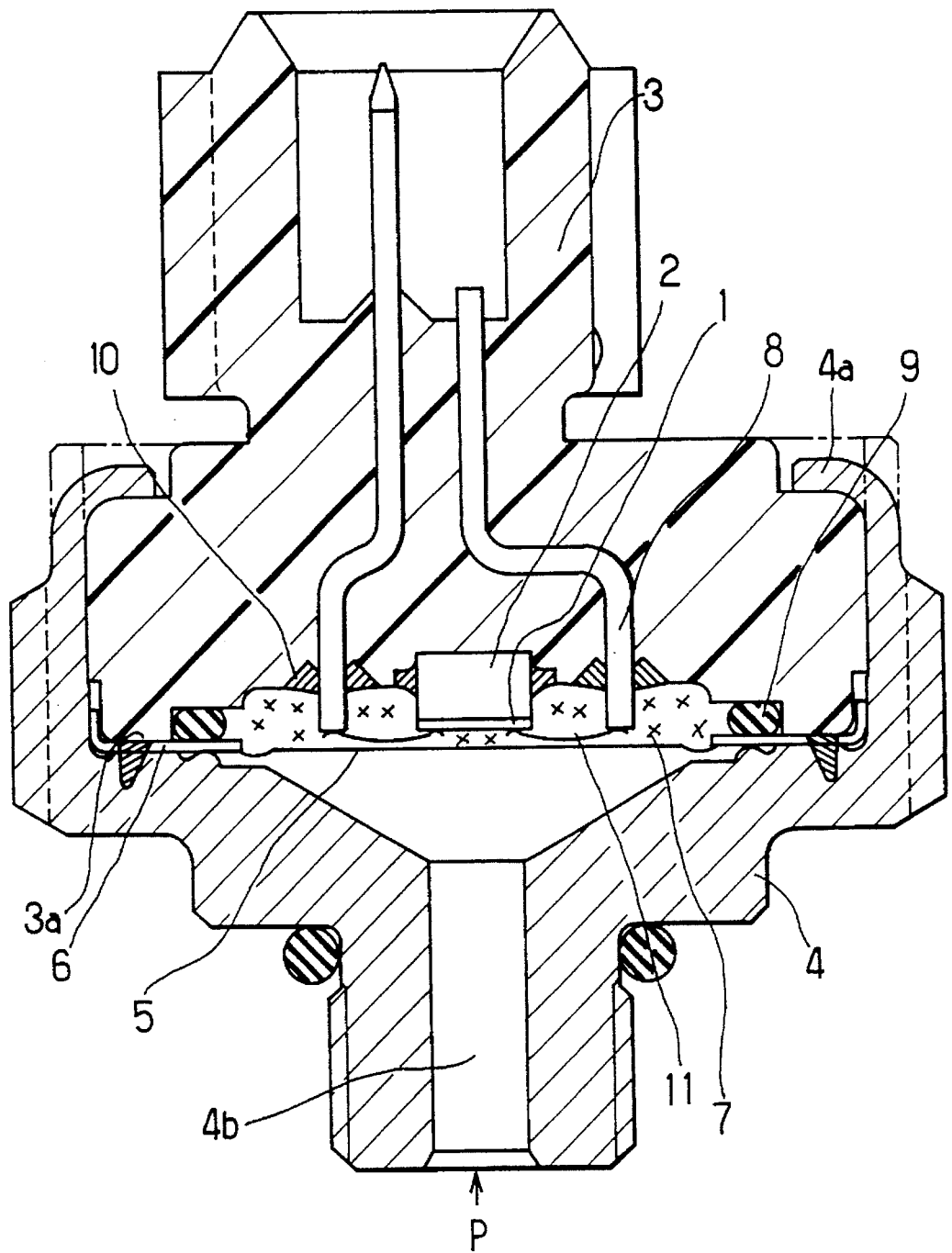
FIG. 1 is a cross-sectional side view illustrating a semiconductor pressure sensor according to a first embodiment of the present invention.

In a liquid-sealed semiconductor pressure sensor shown in FIG. 1, a pressure sensitive element 1 bonded to a glass base 2 is held in a recess formed inside a connector housing 3 by an adhesive agent 10. The connector housing 3 is made of a high polymer compound material having high permeability for gaseous molecules such as polyphenylene sulfide, polybutylene terephthalate and acrylic resin. Such materials do not have high permeability for any liquid, however. A thin-metal sealing diaphragm 5 and a metal retainer 6 are welded together along the inner periphery of the connector housing 3 and bonded airtightly to an end surface of a pressure intake conduit 4b of a main housing 4 which is made of metal. A sealed pressure detecting chamber is formed between the connector housing 3 and the sealing diaphragm 5 and contains therein fluoro silicone oil as filler oil 7 to be used as a pressure transmitting medium. The retainer 6 protects the metal diaphragm 5 from excessive deformation under excessive pressure applied to the metal diaphragm 5. The filler oil 7 may be replaced by dimethyl silicone oil or fluoro oil or any other liquid having appropriate properties. Connecter pins 8 for signal output terminals are insert-molded and held in the connector housing 3. The interface between the connector pins 8 and the molding material of the connector housing 3 is sealed by an adhesive agent 10. The agent 10 may include some filler material or a metal ring having a thermal expansion coefficient lower than that of the agent 10 to ensure the seal's integrity. An O-ring 9 is disposed between the opening end of the recess of the connector housing 3 and the retainer 6 to form a liquid-tight structure.

In this embodiment, the pressure sensitive element 1 is formed integral with a control circuit for temperature compensation as described above. Alternatively, the control circuit may be disposed in the pressure detecting chamber or outside the pressure sensor.

Next a method of filling the oil 7 into the semiconductor pressure sensor will be explained.

At first, the connector housing 3 is inverted relative to the orientation of FIG. 1 so that the recess in the connector 3 opens upwardly. A glass base 2 with the pressure sensitive element 1 bonded thereto is placed into the recess of the connector housing 3 and electrically connected to the connector pins 8 by the bonding wires 11. An 0-ring 9 is then placed on the open end of the recess of the connector housing 3 as shown in FIG. 1. Subsequently, a fixed amount of oil 7 is filled into the recess of the connector housing 3 from its upper side by a dispenser (not shown) or the like. The filler oil 7 may be dispensed by placing the connector housing 3 on a scale (not shown) and filling oil 7 fed therein up to a fixed weight so that the sealing diaphragm 5 forms an ideal shape for the pressure sensor, as shown in FIG. 1, in which no air bubbles exist. The amount of oil 7 is a quantity of the oil 7 which causes no excessive internal pressure and no distortion to the diaphragm 5 after performance of a third step, which will be described later. The level of the fixed-volume filler oil 7 filled therein is slightly lower than the upper end surface of the O-ring 9.

Secondly, the main housing 4 having the sealing diaphragm 5 and retainer 6 bonded to the whole periphery thereof in advance is placed on and fitted to the connector housing 3 while the horizontal level of the housing 3 is maintained. Then, the main housing 4 is pressed down on the connector housing 3 to establish sufficient contact with the retainer 6. Thereafter, the whole peripheral end surface 4a of the main housing 4 is bent against a shoulder or step portion of the connector housing 3 to hold the connector housing as shown in FIG. 1. Thus, the retainer 6 abuts the upper end surface of the O-ring 9, and an airtight chamber is formed between the connector housing 3 and the sealing diaphragm 5 which is sealed by the O-ring 9. The O-ring 9 is deformed as the connector housing 4 is pressed down and the retainer 6 abuts the upper surface 3a of the connector housing 3.

In this stage, the volume of the oil-air-bubble mixture contracts and the internal pressure of the pressure detecting chamber has increased. Consequently, the sealing diaphragm 5 bends opposite the pressure sensitive element 1.

Therefore, thirdly, a pressure of a prescribed value is applied on the sealing diaphragm 5 through the pressure intake conduit 4b. Such pressure is used to dissolve the air bubbles trapped in the oil-air mixture of the pressure detecting chamber formed during the previous step into the filler oil 7 and further purge the rest of the air through the high polymer compound material used in the housing 3, the adhesive agent 10 and the O-ring 9, thereby eliminating the bubbles.

It is noted that the air or gaseous molecules may penetrate between the molecules of the above high polymer compound material under a certain pressure. In other words, the housing 3 and the O-ring which use the high polymer compound material function as filters not allowing the oil of a greater molecular weight to penetrate therethrough but allowing the air bubbles to pass. As a result, the sealing diaphragm 5 returns to the normal position and forms an ideal shape (without deformation of the sealing diaphragm).

In one aspect of the present invention, where fluoro silicone oil is used as the filler oil 7, silicone rubber is used for the O-ring 9 and an acrylic resin is used for the connector housing 3, the bubbles disappear in 10 minutes at a pressure of 30 kgf/cm$^2$. The solubility of the air to the filler oil 7, for example, is between 16% and 19% vol. in the case of dimethyl silicone oil and is about 60% in the case of fluoro oil.

Although acrylic resin is useful to observe the presence of bubbles, other materials such as polyphenylene sulfide and polybutylene terephthalate are more preferable for use in higher pressure environment. Reliability of the pressure sensor may be further improved by adding fillers to the above described materials to form glass fiber composite materials.

Further, a liquid-sealed pressure sensor according to the present invention may be also provided by applying a prescribed pressure through the pressure intake conduit 4b to the sealing diaphragm 5 until it bends toward the pressure sensitive element, filling an excessive amount of the filler oil in the pressure detecting chamber, and thereafter flooding the filler oil 7 while securing the main housing 4 to the connector housing 3. Thus, sealing diaphragm 5 returns to its normal position and excessive internal pressure buildup in the pressure detecting chamber is prevented.

Figure 6:
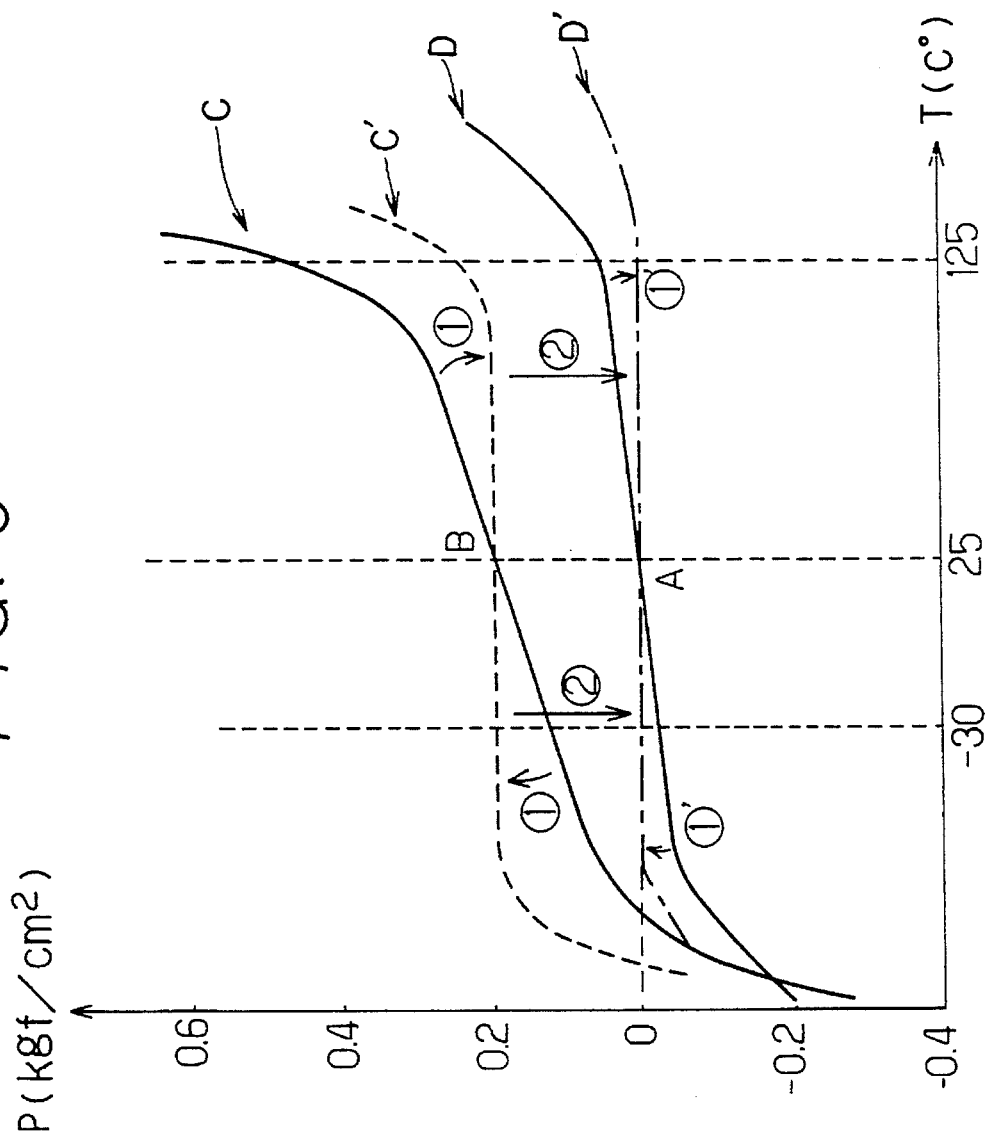
FIG. 6 is a graph showing a relationship between pressure in a pressure detecting chamber of the liquid-sealed semiconductor pressure sensor and temperature in use.
Figure 7:
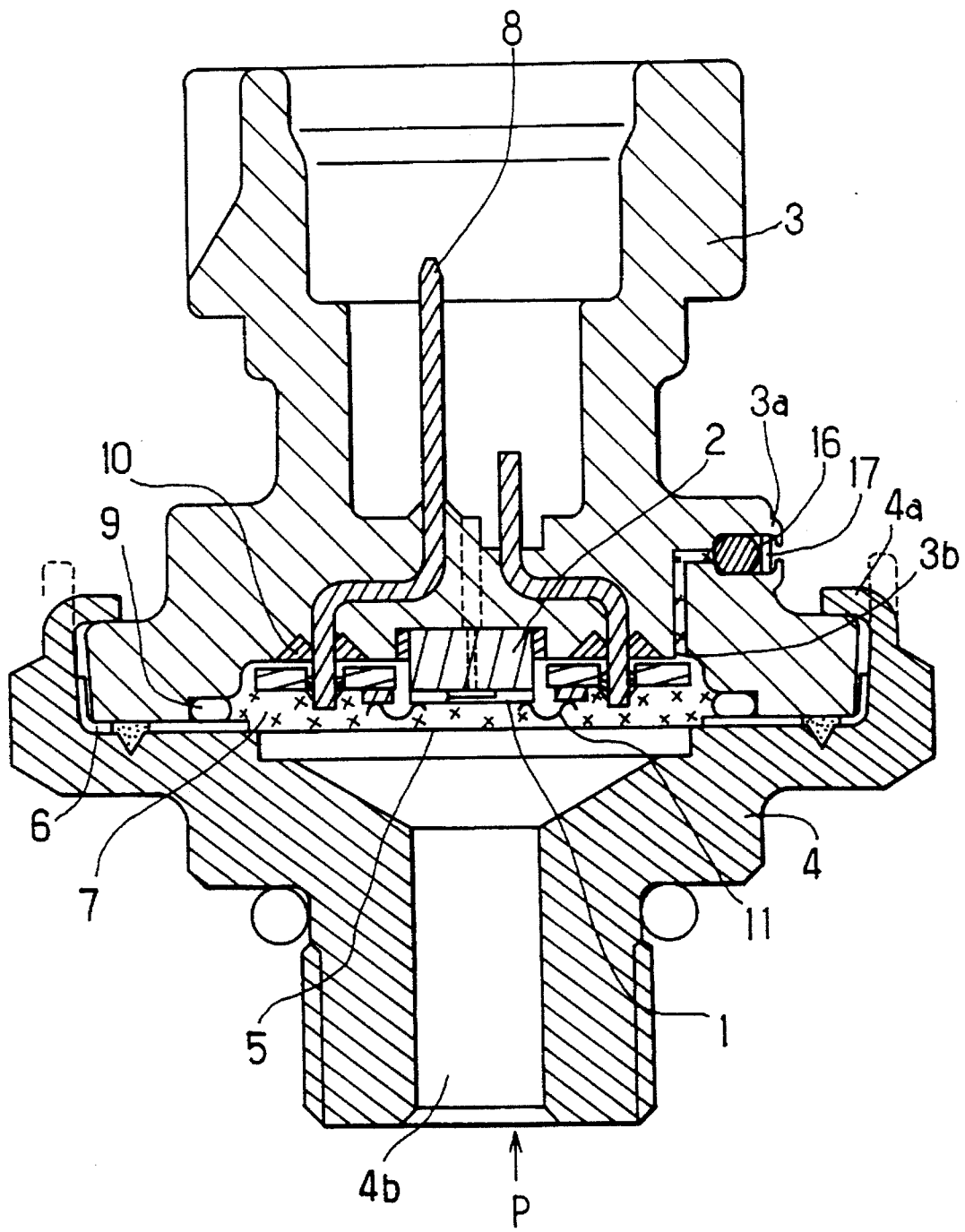
FIG. 7 is a cross-sectional side view illustrating a semiconductor pressure sensor of a related application.

It is desired that the pressure in the pressure detecting chamber is zero. However, in case the pressure sensor is used under comparatively high temperature conditions, e.g. temperatures from 25° C. up to 150° C., the critical temperature to maintain the proportional relationship between output voltage and temperature should be higher than 150 ° C. In this case, the volume of the filler oil 7 is less than that described above so that the pressure in the pressure detecting chamber at room temperature may be negative after the third step (the pressure application step). In other words, the curve D shown in FIG. 6 is shifted to the right.

There is a case in which the output signal is lowered by leaking of electric current from a control circuit at high temperature conditions. Such changes may be compensated by the non linear characteristics of the sharp pressure increase at higher temperatures in the pressure detecting chamber, so that the proportional relation between the output voltage and the temperature may be obtained. In this case, the volume of the filler oil 7 is increased to get a positive pressure in the pressure detecting chamber at the room temperature after the third step. In other words, the curve D is shifted to the left relative to the graph shown in FIG. 6.

As stated above, the pressure in the pressure detecting chamber may be selected according to various requirements of the pressure sensor when used in various applications.

Figure 2A:
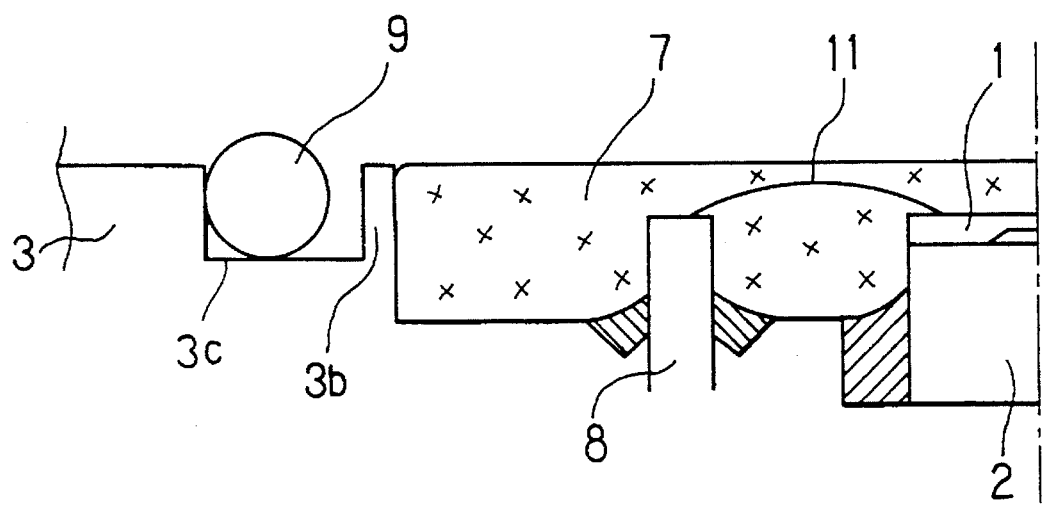
FIGS. 2A and 2B are cross-sectional side views illustrating the main portion of a semiconductor pressure sensor according to a second embodiment of the present invention.
Figure 2B:
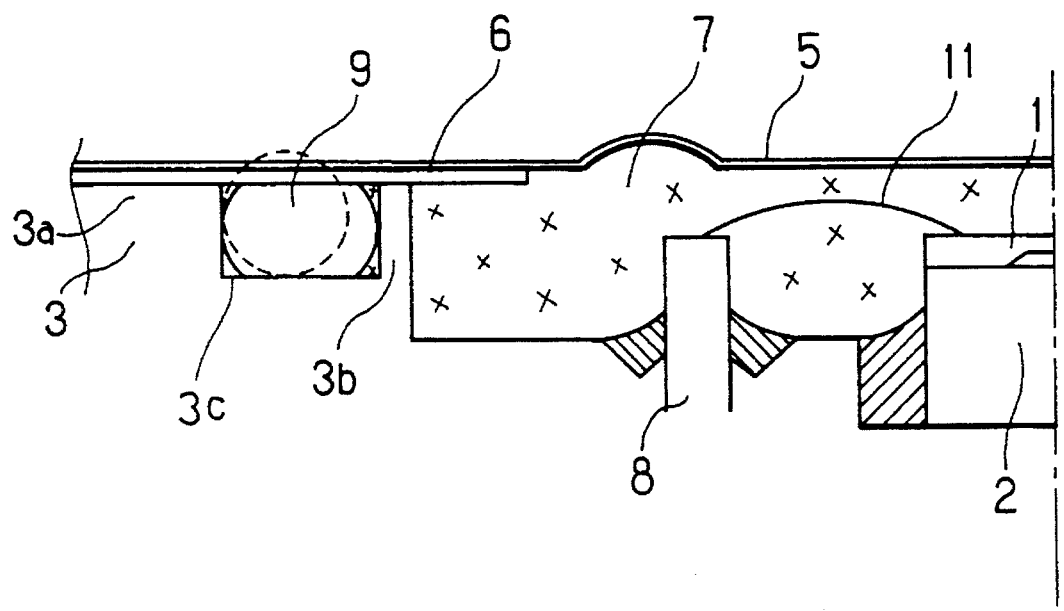

A step for sealing the oil 7 within the sensor will be explained next with reference to the second embodiment shown in FIGS. 2 A and 2B.

In the second embodiment, an annular wall 3b and an annular groove 3c are formed on the end surface of the connector housing 3. The annular wall 3b and the annular groove 3c are formed so that the O-ring 9 under compression may be snugly received in the groove 3c. At the beginning, the filler oil 7 fills the recess of the connector housing 3 as in the first step of the first embodiment shown in FIG. 1. At this time, the oil 7 should not be filled in the groove 3c outside the wall 3b. The volume of the filler oil 7 without air bubbles is measured to be an amount appropriate to position the sealing diaphragm 5 at a normal position or to form an ideal shape as mentioned before.

Subsequently, the main housing 4 (not shown) having the sealing diaphragm 5 soldered to the retainer 6 at its periphery is kept level and pressed down on the connector housing 3 until the upper end surface 3a of the connector housing 3 abuts the retainer 6 completely. Thereafter, the open end 4a (not shown) of the main housing 4 is bent to hold the connector housing 3 along its periphery, and the step of sealing the oil 7 within the sensor is thereby completed. The cross section of the O-ring 9 before compression is shown by a broken line, and is shown in its compressed form as shown by a solid line in FIG. 2b.

The effect of the wall 3b in the semiconductor pressure sensor will be explained as follows. As explained with reference to FIG. 6, the volume of the filler oil 7 in the recess is critical to achieving an ideal shape for the sealing diaphragm 5. However, after a fixed volume of the filler oil 7 has been filled during the first and second steps, the oil may leak through gaps between the recess of the connector housing 3 and the O-ring 9 toward the wall of the recess shown in FIG. 1 if the leveling of the main housing 4 during the press-fitting is not made correctly. As a result, the volume of the oil 7 may be less than the desired volume. The annular wall 3b shown in FIG. 2 prevents such oil leakage. Although a slight volume of oil may overflow from the upper end surface of the wall 3b, it is blocked by the O-ring 9. Since the leaking is so small and is taken into account in advance, it is negligible and should not significantly affect the pressure in the pressure detecting chamber.

Figure 3A:
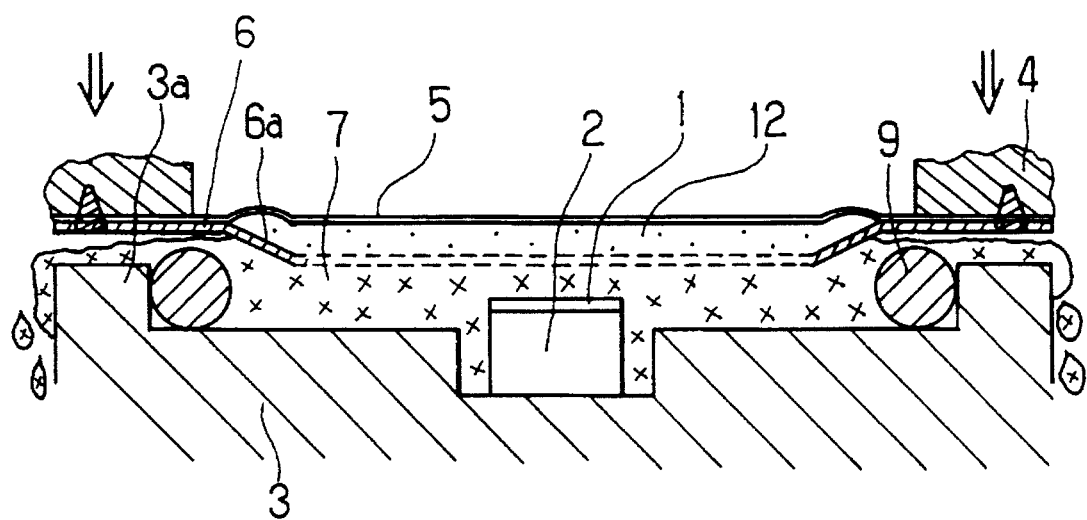
FIGS. 3A and 3B are cross-sectional side views illustrating the main portion of a semiconductor pressure sensor according to a third embodiment of the present invention.
Figure 3B:
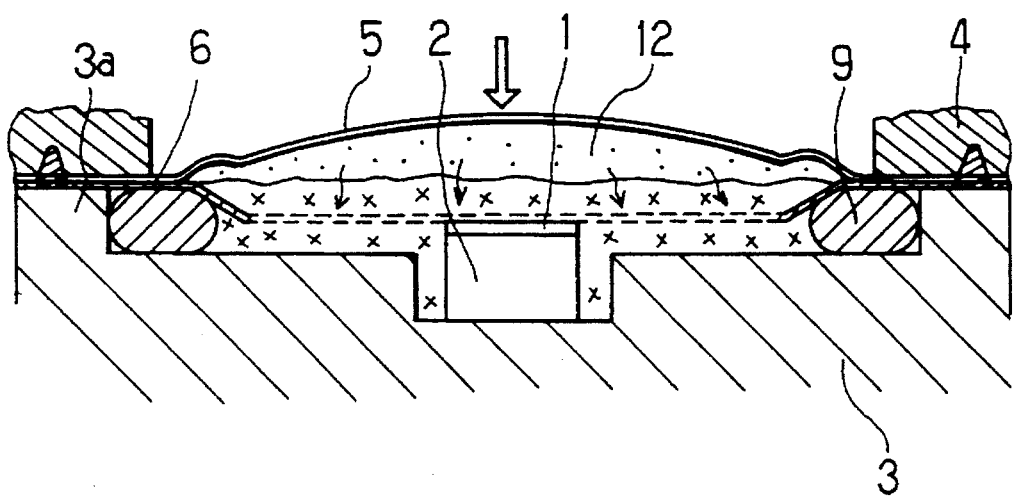

A step of filling the filler oil 7 in the pressure sensor according to a third embodiment of the present invention will be explained next with reference to FIGS. 3A and 3B. The retainer 6 with the sealing diaphragm 5 welded on the periphery thereof is characterized by a slanted annular or tapered brim 6a.

As in the first embodiments filling step described with reference to FIG. 1, filler oil 7 having high air solubility fills the recess of the connector housing 3 with a side of pressure sensitive element 1 facing upward until the oil level becomes as high as the O-ring, and the filler oil 7 is air-purged under reduced pressure.

Subsequently, the main housing 4 having the welded assembly of sealing diaphragm 5 and the retainer 6 secured thereto is put on the connector housing 3. The space between the head of the retainer's tapered brim 6a and the sealing diaphragm 5 contains air 12. As the main housing 4 approaches the connector housing 3 and the tapered brim 6a is soaked in the oil, the oil 7 overflows through gaps between the O-ring 9 and the retainer 6 as shown in FIG. 3 A until the gaps between the O-ring 9 and the retainer 6 are closed.

Figure 4:
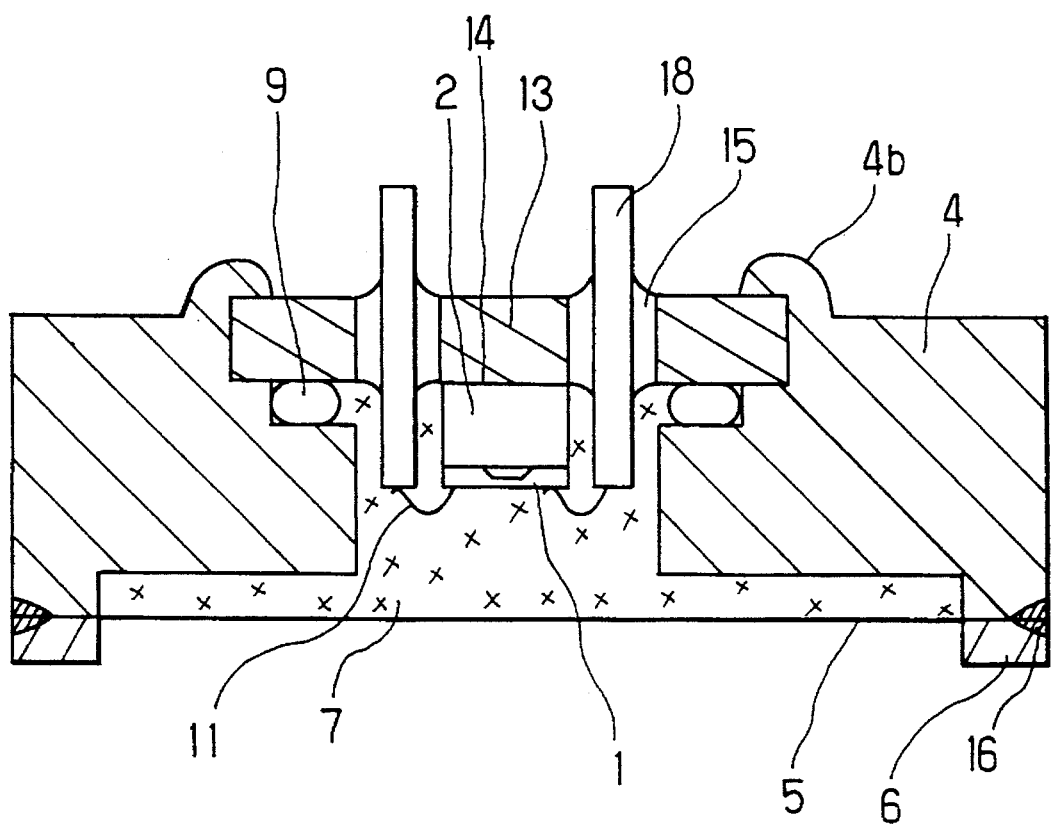
FIG. 4 is a cross-sectional side view illustrating the main portion of a semiconductor pressure sensor according to a fourth embodiment of the present invention.

A semiconductor pressure sensor according to a fourth embodiment of the present invention will be described next with reference to FIG. 4, the same reference numerals are put on portions of FIG. 4 corresponding to the portions illustrated in FIG. 1. While the recess for the filler oil 7 is formed in the connector housing 3 or in the member having the pressure sensitive element 1 in the embodiment shown in FIG. 1, the recess illustrated in FIG. 4 is formed in the housing 4 having the sealing diaphragm 5. It is noted that the connector housing 4 described in FIG. 1 and in other embodiments is replaced by a stem plate 13.

Initially, an assembly of the sealing diaphragm 5 and the retainer 6 welded together at a welding portion 16 is secured to the main housing 4, and the filler oil 7 fills the recess of the main housing 4. Subsequently, the O-ring 9 is placed on the open-end peripheral surface of the main housing 4 as shown in FIG. 4.

The stem plate 13 has through holes 15 to receive pins 18 hermetically sealed therein by glass, glass base 2 secured thereto by an adhesive agent and the pressure sensitive element 1 bonded to the glass base 2. The pressure sensitive element 1 is connected to the pins 18 by bonding wires 11. The stem plate 13 is placed on the O-ring 9, pressed down so that the main housing 4 and the stem plate 13 are in close contact with each other, and finally fixed in place by a sealing portion 4b formed over the entire periphery of the main housing 4.

The volume of the filler oil 7 without air bubbles should be a volume appropriate maintain the sealing diaphragm at its ideal shape (no bending). The air bubbles are also trapped in the oil 7 in this step just after the stem plate 13 has been secured to the main housing. The air bubbles are subsequently dissolved into the filler oil 7 as stated before.

A connector member may be provided on the stem plate 13 if necessary. Of course, the embodiment shown in FIG. 4 may be used as a pressure detector.

A fifth embodiment will be explained with reference to FIGS. 5 A and 5 B. While the O-ring 9 made of silicone rubber or the like was mentioned as a sealing member before, a metal washer is used instead of the O-ring 9 in this embodiment. The stem plate 13 is made of metal or the same high polymer compound material as described with reference to the previous embodiments and the main housing 4 is made of metal.

Figure 5A:
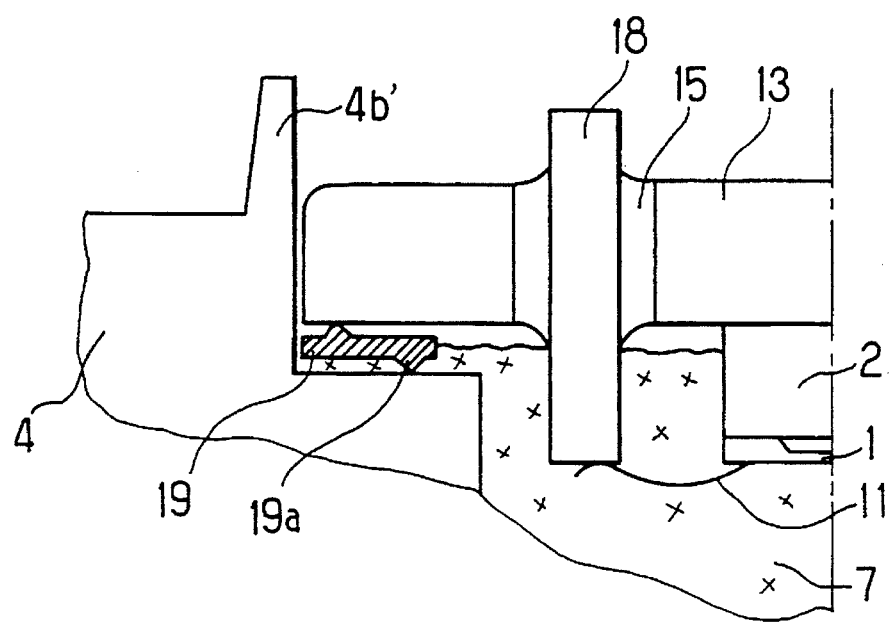
FIGS. 5A and 5B are cross-sectional side views illustrating the main portion of a semiconductor pressure sensor according to a fifth embodiment of the present invention.
Figure 5B:
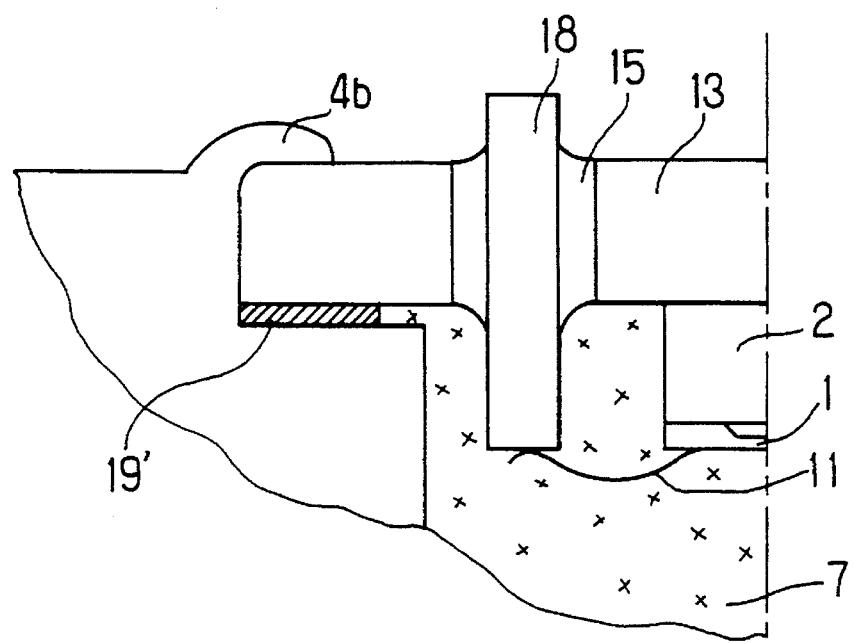

As shown in FIG. 5, the stem plate 13 has through holes 15 to receive pins 18 hermetically sealed therein with glass, the glass base 2 secured by an adhesive agent and the pressure sensitive element 1 bonded to the glass base 2. The pressure sensitive element 1 is electrically connected to the pins 18 by bonding wires 11. The above structure is the same as the structure shown in FIG. 4. A washer 19 having annular projections 19a formed on both surfaces thereof is placed on the peripheral surface of the recess of the main housing 4. Thereafter, a fixed volume of the oil 7 of a fixed volume is fills the recess and the stem plate 13 is put on the washer 19.

Subsequently, pressure is applied on the stem plate 13 and the washer 19 until the projection 19a is flattened as indicated by the reference numeral 19' in FIG. 5 B. Thereafter, the sealing portion 4b' of the main housing 4 is bent to hold the stem plate 13 as indicated by reference numeral 4b in FIGS. 5 A and 5 B. When pressure is applied to the sealing diaphragm 5 in the same manner as in the previous embodiments, the air bubbles are dissolved into the filler oil 7 and the sealing diaphragm 5 forms an ideal shape so that the pressure in the pressure detecting chamber becomes 0 (atmospheric pressure).

The washer 19 as a sealing member may be replaced by any kind of washer having deformable annular projections 19a which perform a sealing function by deforming under pressure. The washer 19 has the equivalent sealing function as the O-ring which is also deformable under pressure. An annular ring of a copper packing material is also available for use as the metal sealing member 19.

After the third step of the previous embodiments in which the air bubbles trapped in the oil 7 are eliminated, the pressure in the pressure detecting chamber is set to 0 (atmospheric pressure). In case the temperature range in use is relatively high, the internal pressure in the pressure detecting chamber is set to a prescribed value as described in connection with the first embodiment.

In another embodiment of the present invention a volume of 152 mm$^3$ of fluoro oil fills the recess of the connector housing 3 under a pressure of 0.05 atmospheres and is left as is for about 200 minutes. As a result, the air volume contained in the filler oil becomes 27.5 mm$^3$ (18.2% solubility of air). Subsequently, the main housing 4 is secured to the connector housing 3 in the same manner as in the previous embodiments; however, under a reduced pressure of 0.05 atmosphere. The third step of applying a pressure greater than atmospheric pressure is not necessary in this embodiment. However, if the filler oil 7 is replaced by some other oil of lower air solubility than fluoro oil, pressure may be applied on the sealing diaphragm 7 to eliminate the air bubbles in the pressure detecting chamber.

In the foregoing discussion of the present invention, the invention has been described with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than a restrictive, sense.

What is claimed is:

1. A method of manufacturing a semiconductor pressure sensor having a pressure transmitting medium held in a chamber which is formed in a recess of a connecting member and sealed by a metal diaphragm member secured to a housing having a pressure intake conduit, said method comprising the sequential steps of:

orienting the connecting member so that the recess opens upwardly;

filling a volume of transmitting medium approximately equal to a volume of said chamber into said recess of said connecting member;

press-fitting and securing said housing, with said diaphragm member interposed between said housing and said connecting member, to said connecting member to form said chamber; and applying to said diaphragm member a prescribed pressure through said pressure intake conduit for a prescribed period to dissolve air trapped in said chamber into said transmitting medium.

2. A method of manufacturing a semiconductor pressure sensor according to claim 1, further comprising the step of;

applying pressure to said diaphragm member through said pressure intake conduit to purge said air trapped in said chamber through said connecting member so that said connecting member acts as a molecular filter.

3. A method of manufacturing a semiconductor pressure sensor according to claim 1, wherein:

said step of press-fitting said housing is carried out under a pressure lower than atmospheric pressure.

4. A method of manufacturing a semiconductor pressure sensor according to claim 1, further comprising the step of:

exposing said pressure transmitting medium to a reduced pressure for a prescribed period to purge the air from said pressure transmitting medium.

5. A method manufacturing a semiconductor pressure sensor according to claim 1, wherein said step of filling comprises the steps of:

filling a volume of said pressure transmitting medium larger than said chamber volume in said recess; and flooding said transmitting medium from said recess during said step of press-fitting.

6. A method of manufacturing a semiconductor pressure sensor according to claim 1, wherein said step of filling said pressure transmitting medium comprises the step of:

exposing said pressure transmitting medium to a reduced pressure for a prescribed period to purge air from said pressure transmitting medium.

7. A method of manufacturing a semiconductor pressure sensor according to claim 3, wherein said step of filling said pressure transmitting medium comprises the step of:

exposing said pressure transmitting medium to said reduced pressure for a period to purge air from said pressure transmitting medium.

8. A method of manufacturing a semiconductor pressure sensor according to claim 4, wherein said pressure transmitting medium is fluoro oil, said reduced pressure is approximately 0.05 atmospheric pressure and said period to purge the air is approximately 200 minutes.

9. A method of manufacturing a semiconductor pressure sensor according to claim 6, wherein said step of press-fitting is carried under a reduced pressure.

10. A method of manufacturing a semiconductor pressure sensor according to claim 7, wherein said step of press-fitting is carried under a reduced pressure.

11. A method of manufacturing a semiconductor pressure sensor according to claim 1, wherein said prescribed pressure of said step of applying pressure is approximately 30 kgf/cm$^2$ and said prescribed period of said step of applying pressure is about 10 minutes.

12. A method for manufacturing a semiconductor pressure sensor according to claim 8, wherein said prescribed pressure of said step of applying pressure is approximately 30 kgf/cm$^2$ and said prescribed period of said step of applying pressure is about 10 minutes.

\* \* \* \* \*